(12) United States Patent
Kim et al.

(10) Patent No.: US 7,764,566 B2
(45) Date of Patent: Jul. 27, 2010

(54) DRIVER, AND A SEMICONDUCTOR MEMORY DEVICE HAVING THE SAME

(75) Inventors: Pan-Jong Kim, Seoul (KR); Hyun-Su Choi, Suwon-si (KR); Jung-Hak Song, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 235 days.

(21) Appl. No.: 12/010,350

(22) Filed: Jan. 24, 2008

(65) Prior Publication Data

US 2008/0212395 A1   Sep. 4, 2008

(30) Foreign Application Priority Data

Jan. 26, 2007   (KR)   ................ 10-2007-0008451

(51) Int. Cl.
*G11C 11/34* (2006.01)

(52) U.S. Cl. .................. 365/230.06; 365/194

(58) Field of Classification Search ............ 365/230.06, 365/194

See application file for complete search history.

(56) References Cited

U.S. PATENT DOCUMENTS

| 5,202,851 | A | 4/1993 | Do |
| 6,275,102 | B1 * | 8/2001 | Muza ............ 330/85 |
| 6,313,703 | B1 * | 11/2001 | Wright et al. ............ 330/149 |
| 2001/0030581 | A1 * | 10/2001 | Dent ............ 330/297 |
| 2003/0201759 | A1 * | 10/2003 | Cern ............ 323/247 |
| 2004/0164793 | A1 * | 8/2004 | Muza ............ 330/69 |

FOREIGN PATENT DOCUMENTS

| KR | 1994-10098 | 5/1994 |
| KR | 10-2001-0083351 | 9/2001 |

OTHER PUBLICATIONS

Korean Office Action dated Feb. 28, 2008.

* cited by examiner

*Primary Examiner*—Michael T Tran
(74) *Attorney, Agent, or Firm*—Harness, Dickey & Pierce, P.L.C.

(57) ABSTRACT

A driver may include a driving unit and/or a boosting unit. The driving unit may be configured to provide a driving signal to at least one load. The boosting unit may be configured to boost the driving signal based on transition time points of the driving signal to reduce a distortion of the driving signal. The transition time points may be time points during a transition of the driving signal from a first level to a second level.

25 Claims, 6 Drawing Sheets

DRIVER, AND A SEMICONDUCTOR MEMORY DEVICE HAVING THE SAME

PRIORITY STATEMENT

This application claims the benefit of priority under 35 USC §119 to Korean Patent Application No. 10-2007-0008451, filed on Jan. 26, 2007 in the Korean Intellectual Property Office (KIPO), the entire contents of which are incorporated herein their entirety by reference.

BACKGROUND

1. Field

Example embodiments relate to a driver, and for example, to a driver configured to reduce a driving signal distortion, and a semiconductor memory device having the driver.

2. Description of Related Art

A capacity of a memory device including a semiconductor memory device is ever-increasing. For example, a number of memory cells in a unit area of the semiconductor memory device are increasing. Generally, the semiconductor memory device includes a driver for driving the memory cells. For example, a dynamic random access memory (DRAM) device and a static random access memory (SRAM) device have a word-line driver for driving word-lines.

A driver may provide a driving signal (e.g. word-line selection signal) to drive the memory cells. The driving signal is distorted as the driving signal is transferred along the word-line from the driver because the number of the memory cells is relatively large. In other words, a transition time of the driving signal (e.g. a time for the driving signal to transit from logic "low" to logic "high") is increased as the driving signal is applied farther away from the driver.

Figure 1:
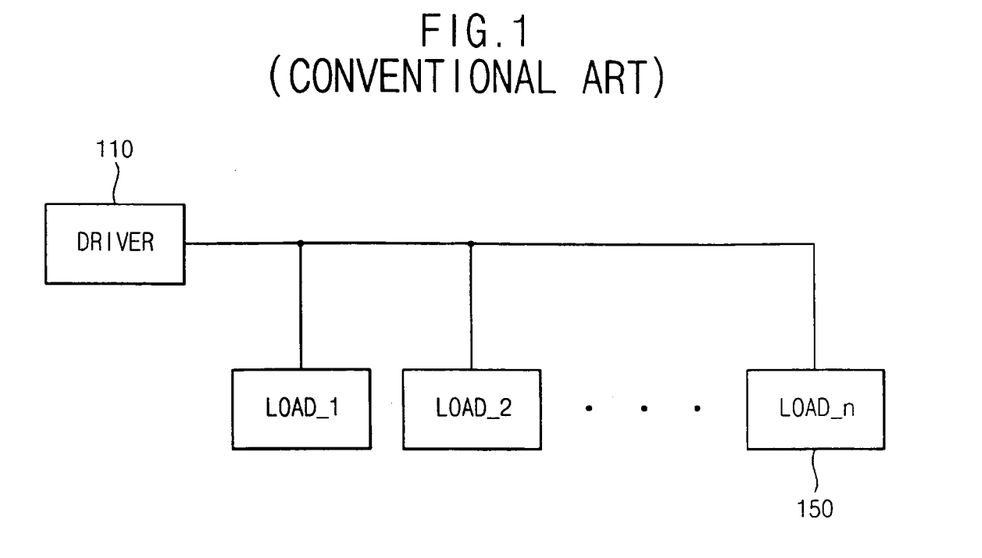
FIG. 1 is a block diagram illustrating a driver using a conventional method of reducing a driving signal distortion by increasing a size of the driver.
Figure 2:
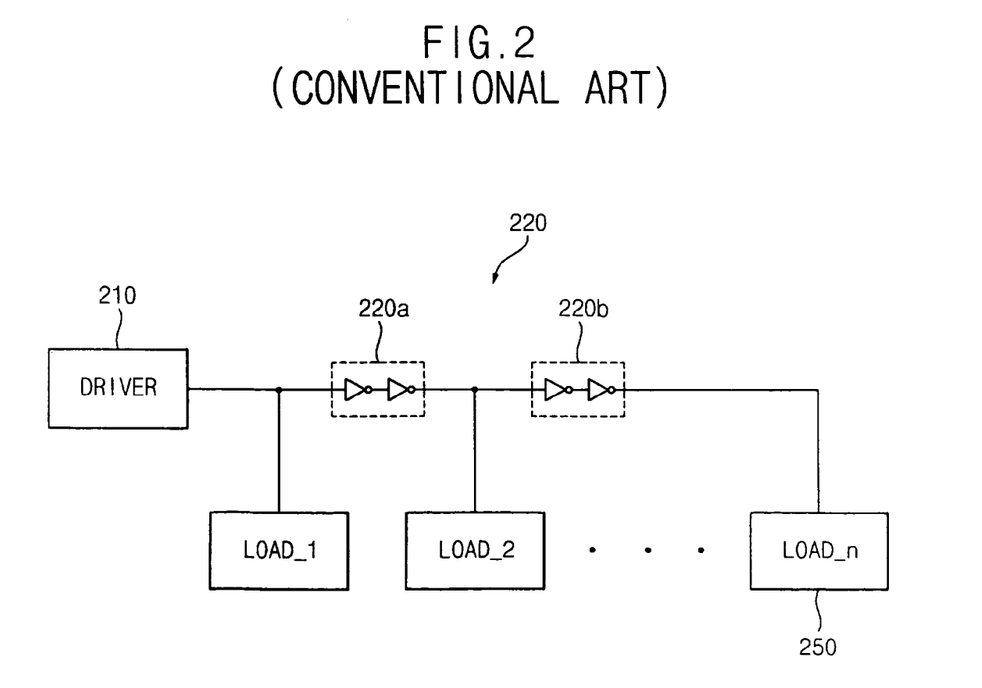
FIG. 2 is a block diagram illustrating a driver using a conventional method of reducing a driving signal distortion by disposing a buffer between loads.

FIGS. 1 and 2 are block diagrams illustrating drivers using conventional methods of reducing a driving signal distortion.

The method of FIG. 1 reduces the driving signal distortion by increasing the size of the driver 110. For example, a larger driver 110 is connected to the loads 150. The method of FIG. 2 reduces the driving signal distortion by disposing buffers 220 between loads 250 (e.g. capacitors of a memory device). For example, buffers 220a and 220b are connected between the loads 250 connected to a driver 210.

Figure 3:
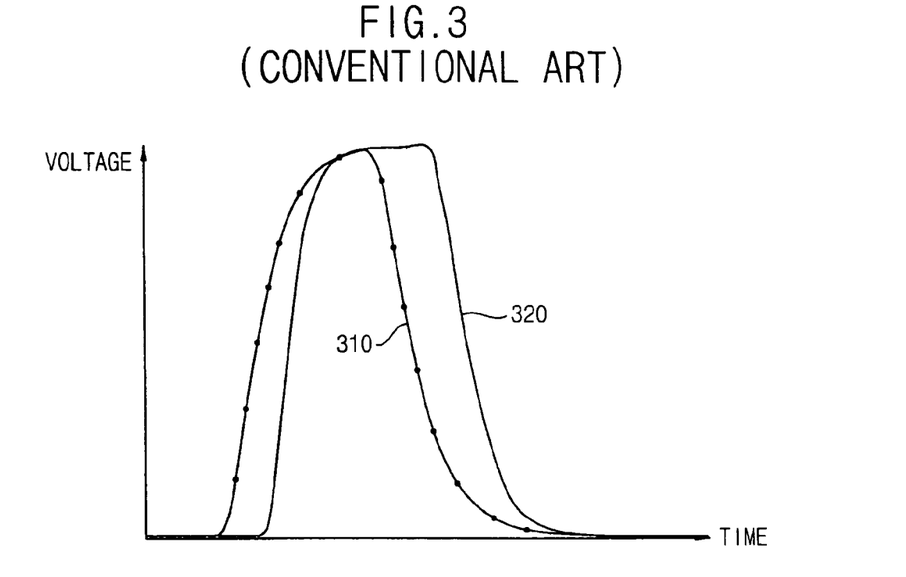
FIG. 3 is an example graph diagram illustrating an example simulation result of drivers using the conventional method of FIG. 1 and the conventional method of FIG. 2.

FIG. 3 is an example graph diagram illustrating an example simulation result of drivers using the conventional method of FIG. 1 and the conventional method of FIG. 2. The horizontal axis denotes an elapsed time and the vertical axis denotes a voltage level.

A first curve 310 indicates the simulation result at a load LOAD_n 150 connected to the driver 110 using the method of reducing a driving signal distortion by increasing a size of the driver 110. A second curve 320 indicates the simulation result at a load LOAD_n 250 connected to the driver 210 using the method of reducing a driving signal distortion by disposing the buffer 220 between the loads.

In case of the driver 110 using the method of reducing the driving signal distortion by increasing the size of the driver 110, a square wave pulse is improperly formed because a driving signal more gradually transits from logic "low" to logic "high", and more rapidly transits from logic "high" to logic "low". However, a time distortion of the driving signal occurs less noticeably if the driving signal transits from logic "low" to logic "high".

In case of the driver 210 using the method of reducing the driving signal distortion by disposing the buffer 220 between the loads, a time distortion (i.e. a delay time) occurs because of the buffer 220. However, the driving signal is similar to the square wave pulse.

SUMMARY

Example embodiments may provide a driver configured to reduce a driving signal distortion.

Example embodiments may provide a semiconductor memory device including a driver configured to reduce a driving signal distortion.

Example embodiments may provide a method of driving at least one load to reduce a driving signal distortion.

According to an example embodiment, a driver may include a driving unit and/or a boosting unit. The driving unit may be configured to provide a driving signal to at least one load. The boosting unit may be configured to boost the driving signal based on transition time points of the driving signal to reduce a distortion of the driving signal. The transition time points may be time points during a transition of the driving signal from a first level to a second level.

According to an example embodiment, the boosting unit may be configured start boosting the driving signal if a transition of the driving signal starts and/or maintain boosting of the driving signal during a time period.

According to an example embodiment, the boosting unit may be configured to stop boosting the driving signal if the transition of the driving signal is finished.

According to an example embodiment, the boosting unit may be configured to generate an inverted driving signal based on the driving signal if the transition of the driving signal starts and boost the driving signal based on a delay time between the driving signal and the inverted driving signal.

According to an example embodiment, the delay time may be less than a difference between a starting time point of the transition of the driving signal and a finishing time point of the transition of the driving signal.

According to an example embodiment, the boosting unit may include a delay controlled inverting unit configured to receive the driving signal and invert the driving signal to generate the inverted driving signal with the delay time.

According to an example embodiment, the boosting unit may be configured to boost the driving signal by providing at least one of a current and a voltage to the at least one load during the delay time.

According to an example embodiment, the boosting unit may further include a power source configured to provide the at least one of the current and the voltage to the at least one load based on a control signal and/or a power source controller configured to provide the control signal during the delay time to the power source to provide the at least one of the current and the voltage.

According to an example embodiment, the boosting unit may be configured to generate an inverted driving signal based on the driving signal, control a delay time between the driving signal and the inverted driving signal, and/or boost the driving signal based on the delay time.

According to an example embodiment, the delay time may be less than a difference between a starting time point of the transition of the driving signal and a finishing time point of the transition of the driving signal.

According to an example embodiment, the boosting unit may include a variable delay controlled inverting unit configured to receive the driving signal and invert the driving signal to generate the inverted driving signal with the delay time.

According to an example embodiment, the boosting unit may be configured to boost the driving signal by providing at least one of a current and a voltage to the at least one load during the delay time.

According to an example embodiment, the variable delay controlled inverting unit may include a plurality of inverters having a particular delay time and/or a selector. The inverters may be serially coupled, configured to receive the driving signal, and/or configured to sequentially invert the driving signal. The selector may be configured to sequentially receive the inverted driving signals and/or select one of the inverted driving signals based on a selection signal.

According to an example embodiment, the selection signal may be at least one of input from outside and determined based on a value of a system.

According to an example embodiment, the boosting unit may further include a power source configured to provide the at least one of the current and the voltage to the at least one load based on a control signal and/or a power source controller configured to provide the control signal during the delay time to the power source to provide the current or the voltage.

According to an example embodiment, a semiconductor memory device may include at least one memory block and/or a global line driver. The global line driver may be configured to provide a driving signal to the at least one memory block to drive a particular global line of the at least one memory block and/or boost the driving signal based on transition time points of the driving signal to reduce a distortion of the driving signal. The transition time points may be time points during a transition of the driving signal from a first level to a second level.

According to an example embodiment, the global line driver may include a driving unit and/or a boosting unit. The driving unit may be configured to provide the driving signal to the at least one memory cell. The boosting unit may be configured to boost the driving signal based on the transition time points of the driving signal to reduce the distortion of the driving signal.

According to an example embodiment, the boosting unit may be configured to start boosting the driving signal if a transition of the driving signal starts and/or maintain boosting of the driving signal during a time period.

According to an example embodiment, the boosting unit may be configured to stop boosting the driving signal if the transition of the driving signal is finished.

According to an example embodiment, the boosting unit may be configured to generate an inverted driving signal based on the driving signal if a transition of the driving signal starts and/or boost the driving signal based on a delay time between the driving signal and the inverted driving signal.

According to an example embodiment, the delay time may be less than a difference between a starting time point of the transition of the driving signal and a finishing time point of the transition of the driving signal.

According to an example embodiment, the boosting unit may include a delay controlled inverting unit configured to receive the driving signal and/or invert the driving signal to generate the inverted driving signal with the delay time.

According to an example embodiment, the boosting unit may be configured to boost the driving signal by providing at least one of a current and a voltage to the at least one load during the delay time.

According to an example embodiment, the boosting unit may further include a power source and/or a power source controller. The power source may be configured to provide the at least one of the current and the voltage to the at least one load based on a control signal. The power source controller may be configured to provide the control signal during the delay time for the power source to provide the at least one of the current and the voltage.

According to an example embodiment, the boosting unit may be configured to generate an inverted driving signal based on the driving signal, control a delay time between the driving signal and the inverted driving signal, and/or boost the driving signal based on the delay time.

According to an example embodiment, the delay time may be less than a difference between a starting time point of the transition of the driving signal and a finishing time point of the transition of the driving signal.

According to an example embodiment, the boosting unit may include a variable delay controlled inverting unit configured to receive the driving signal and/or invert the driving signal to generate the inverted driving signal with the delay time.

According to an example embodiment, the boosting unit may be configured to boost the driving signal by providing at least one of a current and a voltage to the at least one load during the delay time.

According to an example embodiment, the variable delay controlled inverting unit may include a plurality of inverters having a particular delay time and/or a selector. The plurality of inverters may be serially coupled, configured to receive the driving signal, and/or configured to sequentially invert the driving signal. The selector may be configured to sequentially receive the inverted driving signals and/or select one of the inverted driving signals based on a selection signal.

According to an example embodiment, the selection signal may be at least one of input from outside and determined based on a value of a system.

According to an example embodiment, the boosting unit may further include a power source and/or a power source controller. The power source may be configured to provide the at least one of the current and the voltage to the at least one load based on a control signal. The power source controller may be configured to provide the control signal during the delay time to the power source to provide the current or the voltage.

According to an example embodiment, a method may include providing a driving signal to at least one load. A driving signal distortion may be reduced by boosting the driving signal based on a transition time points of the driving signal.

According to an example embodiment, boosting the driving signal may start if a transition of the driving signal starts and/or may be maintained during a time period.

According to an example embodiment, boosting the driving signal may stop if the transition of the driving signal is finished.

According to an example embodiment, an inverted driving signal may be generated based on the driving signal if a transition of the driving signal starts. The driving signal may be boosted on the basis of a delay time between the driving signal and the inverted driving signal.

According to an example embodiment, the delay time may be less than a difference between a starting time point of the transition of the driving signal and a finishing time point of the transition of the driving signal.

According to an example embodiment, an inverted driving signal may be generated on the basis of the driving signal if a transition of the driving signal starts. A delay time between the driving signal and the inverted driving signal may be controlled. The driving signal may be boosted based on the delay time.

According to an example embodiment, the delay time may be less than a difference between a starting time point of the transition of the driving signal and a finishing time point of the transition of the driving signal.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 4:
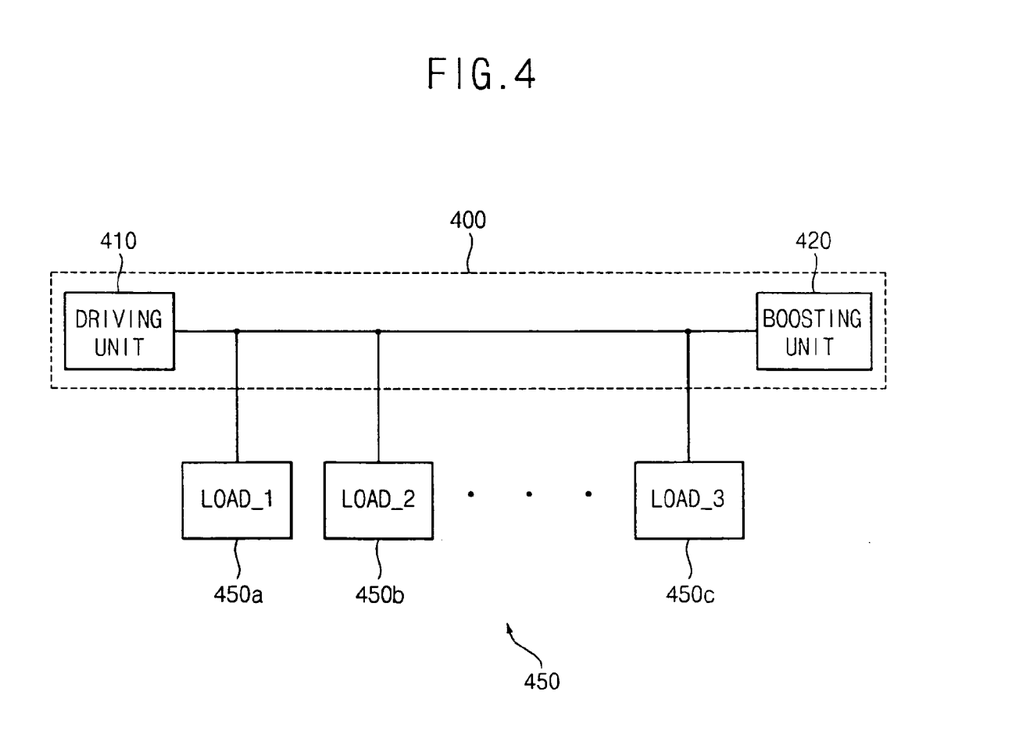
FIG. 4 is a block diagram illustrating a driver according to an example embodiment.

FIG. 4 is a block diagram illustrating a driver according to an example embodiment.

Referring to FIG. 4, the driver 400 may include a driving unit 410 and/or a boosting unit 420.

The driving unit 410 may provide a driving signal to at least one load 450. The at least one load 450 may include loads 450a, 450b, 450c, and/or so on. The driving signal may indicate a voltage or a current for driving the at least one load 450 (e.g. capacitors of a semiconductor memory device).

The boosting unit 420 may reduce a distortion of the driving signal provided from the driving unit 410 by boosting the driving signal based on transition time points of the provided driving signal. For example, a transition of the driving signal from a low level to a high level or from a high level to a low level. The driving unit 410 may boost the driving signal by increasing a voltage or a current of the driving signal that become decreased as the driving signal passes through loads.

Figure 9:
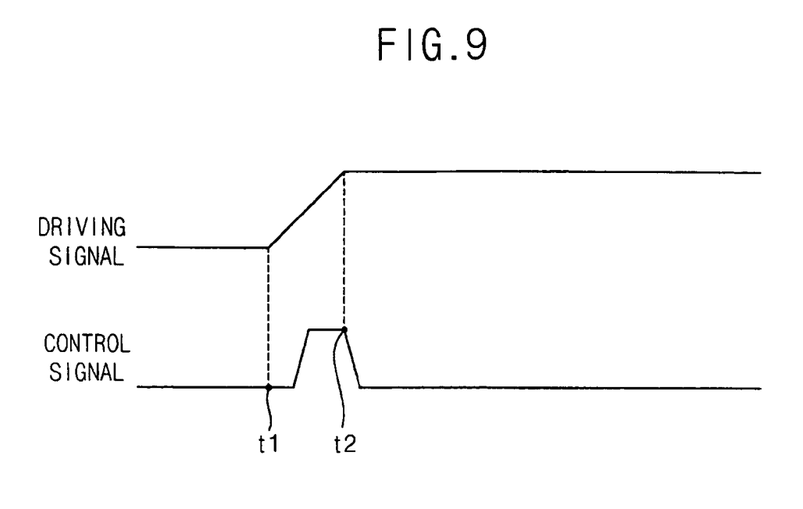
FIG. 9 is an example graph diagram illustrating an example operation of a boosting unit according to an example embodiment.

FIG. 9 is an example graph diagram illustrating an example operation of a boosting unit.

The boosting unit 420 may start boosting a driving signal provided from a driving unit 410 if a transition of the driving signal starts at a time point t1, and/or the boosting unit 420 may maintain boosting the driving signal during a time period (e.g. between the time point t1 and a time point t2).

The boosting unit 420 may stop boosting the driving signal if a transition of the driving signal is finished (e.g. the time point t2). Accordingly, unnecessary power consumption, which may be caused if the driving signal is boosted even after a transition of the driving signal is finished, may be reduced.

Figure 5:
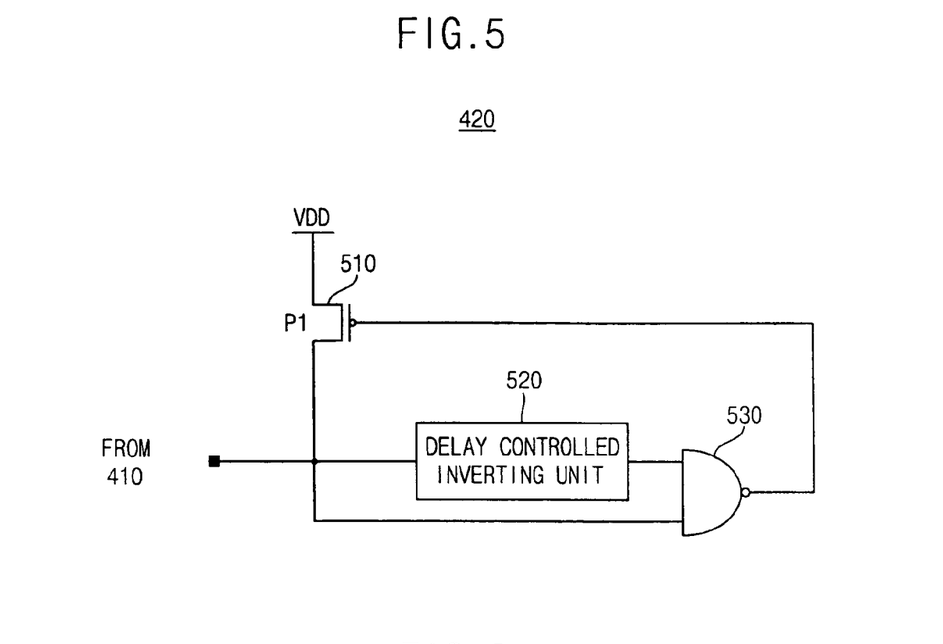
FIG. 5 is a diagram illustrating an example embodiment of a boosting unit in FIG. 4.

FIG. 5 is a diagram illustrating an example embodiment of a boosting unit 420 in FIG. 4.

Referring to FIG. 5, the boosting unit 420 may include a power source 510, a delay controlled inverting unit 520, and/or a power source controller 530.

The boosting unit 420 may generate an inverted driving signal based on a driving signal provided from the a driving unit 410 if a transition of the driving signal begins, and/or the boosting unit 420 may boost the driving signal based on a delay time between the driving signal and the inverted driving signal.

For example, the delay time may be less than a difference between a starting time point of the transition of the driving signal and a finishing time point of the transition of the driving signal.

The power source 510 may provide a current or a voltage to the at least one load 450 based on a control signal. For example, the power source 510 may include a P-channel metal oxide semiconductor (PMOS) transistor P1, and/or the power source 510 may boost the driving signal by applying the control signal to a gate of the PMOS transistor P1. The PMOS transistor P1 may be connected between a power source VDD and a line for the driving signal.

The power source controller 530 may provide the control signal to the power source 510. For example, the power source controller 530 may receive the driving signal, which is provided from the driving unit 410, and the inverted driving signal, which is provided from the delay controlled inverting unit 520, and provide the control signal to the power source 510 if the driving signal and the inverted driving signal have the same value (e.g. during the delay time for generating the inverted driving signal).

The delay controlled inverting unit 520 may receive the driving signal provided from the driving unit 410 and/or invert the driving signal to generate the inverted driving signal with the delay time.

Figure 6:
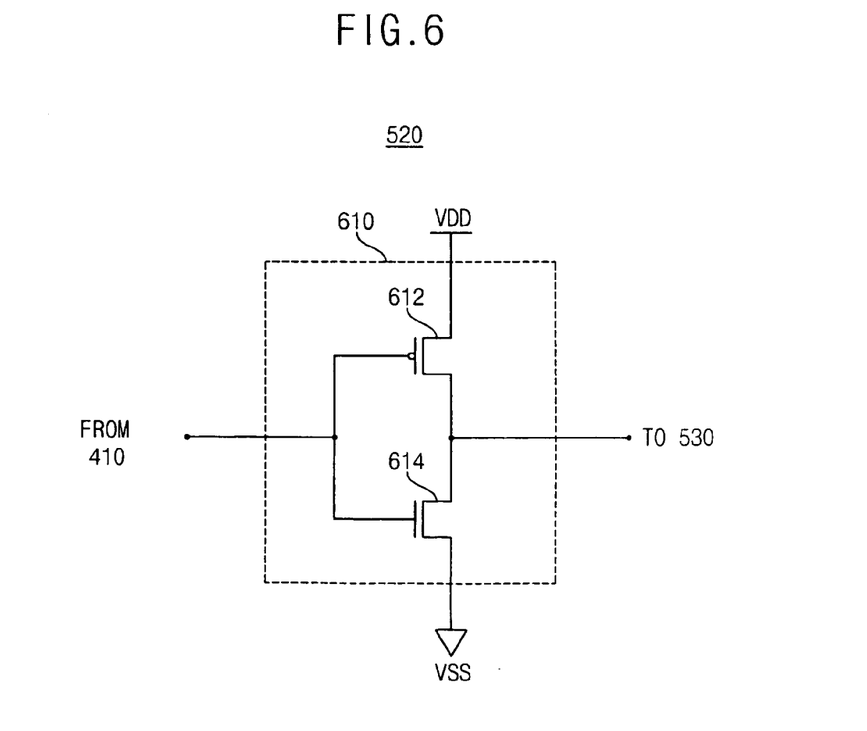
FIG. 6 is a circuit diagram illustrating an example embodiment of a delay controlled inverting unit in FIG. 5.

FIG. 6 is a circuit diagram illustrating an example embodiment of a delay controlled inverting unit 520 in FIG. 5.

Referring to FIG. 6, the delay controlled inverting unit 520 may include a complementary metal oxide semiconductor (CMOS) inverter 610.

The inverter 610 may include a PMOS transistor 612 and an N-type metal oxide semiconductor (NMOS) transistor 614 connected between the power source voltage VDD and a ground voltage VSS. The inverter 610 may receive a driving signal provided from a driving unit 410 and/or invert the driving signal to generate an inverted driving signal with a delay time.

A CMOS inverter may control a delay time of an output signal (e.g. the inverted driving signal) according to a fabrication process of a PMOS or NMOS.

Figure 7:
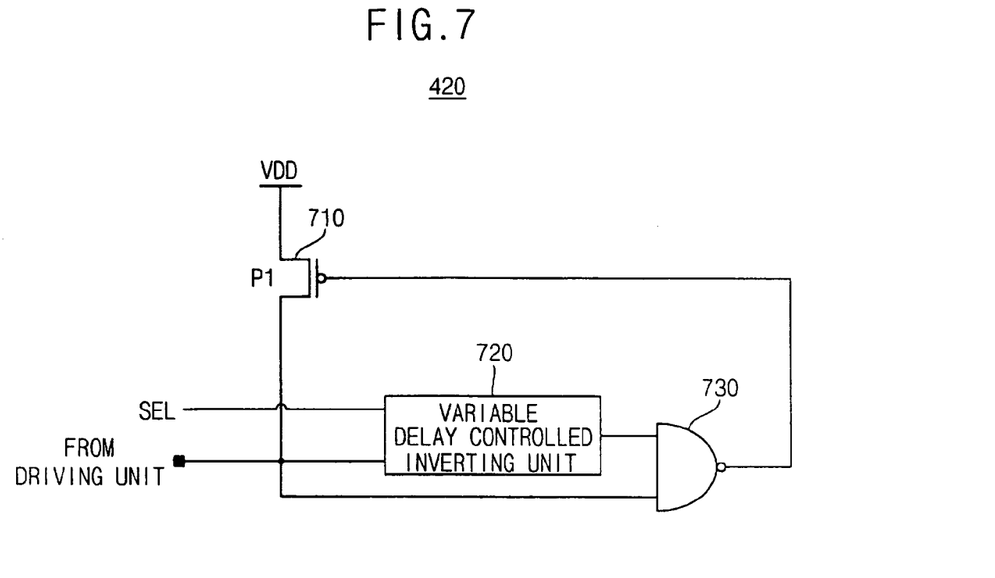
FIG. 7 is a diagram illustrating another example embodiment of a boosting unit in FIG. 4.

FIG. 7 is a diagram illustrating another example embodiment of a boosting unit 420 in FIG. 4.

Referring to FIG. 7, the boosting unit 420 may include a power source 710, a variable delay controlled inverting unit 720, and/or a power source controller 730.

If a transition of a driving signal provided from a driving unit 410 begins, the boosting unit 420 may generate an inverted driving signal based on the driving signal, control a delay time between the driving signal and the inverted driving signal, and/or boost the driving signal based on the delay time.

For example, the delay time may be less than a difference between a starting time point of the transition of the driving signal and a finishing time point of the transition of the driving signal. The delay time may be input from outside or may correspond to a desired, or alternatively, a predetermined value of a system.

The power source 710 may provide a current or a voltage to the at least one load 450 based on a control signal. For example, the power source 710 may include the PMOS transistor P1, and/or the power source 710 may boost the driving signal by applying the control signal to a gate of the PMOS transistor P1.

The power source controller 730 may provide the control signal to the power source 710. For example, the power source controller 730 may receive the driving signal provided from the driving unit 410 and the inverted driving signal provided from the variable delay controlled inverting unit 720, and/or the power source controller 730 may provide the control signal to the power source 710 if the driving signal and the inverted driving signal have the same value (e.g. during a delay time for generating the inverted driving signal).

The variable delay controlled inverting unit 720 may receive the driving signal and a selection signal SEL and invert the driving signal to generate the inverted driving signal with the delay time.

Figure 8:
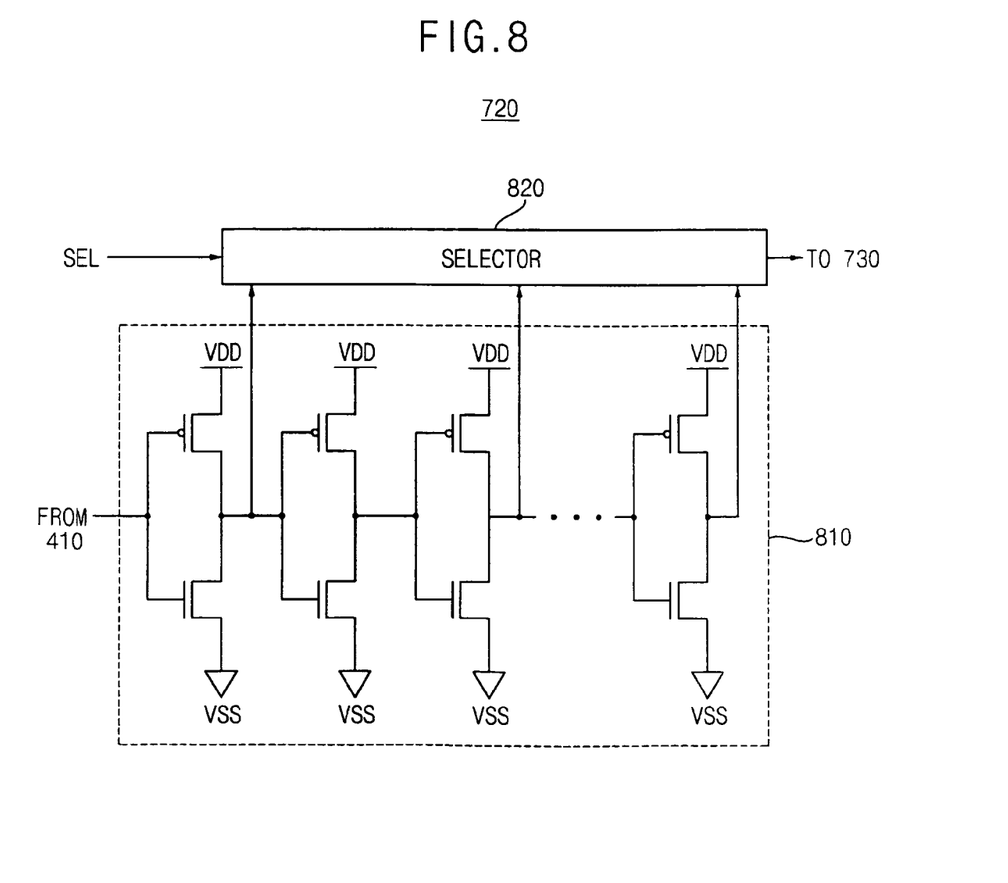
FIG. 8 is a circuit diagram illustrating an example embodiment of a variable delay controlled inverting unit in FIG. 7.

FIG. 8 is a circuit diagram illustrating an example embodiment of a variable delay controlled inverting unit 720 in FIG. 7.

Referring to FIG. 8, the variable delay controlled inverting unit 720 may include a plurality of inverters 810 and/or a selector 820.

The inverters 810 may have a given delay time, receive the driving signal provided from the driving unit 410, and/or sequentially invert the driving signal.

The selector 820 may sequentially receive the inverted driving signals and select one of the inverted driving signals based on the selection signal SEL to provide a delay time. For example, the selection signal SEL may be input from outside or may correspond to a desired, or alternatively, a predetermined value of a system.

A boosting unit 420 of FIG. 5 and FIG. 6 may control a delay time according to a CMOS fabrication process. The boosting unit 420 of FIG. 7 and FIG. 8 may control the delay time according to the number of inverters and/or the selection signal SEL.

Figure 10:
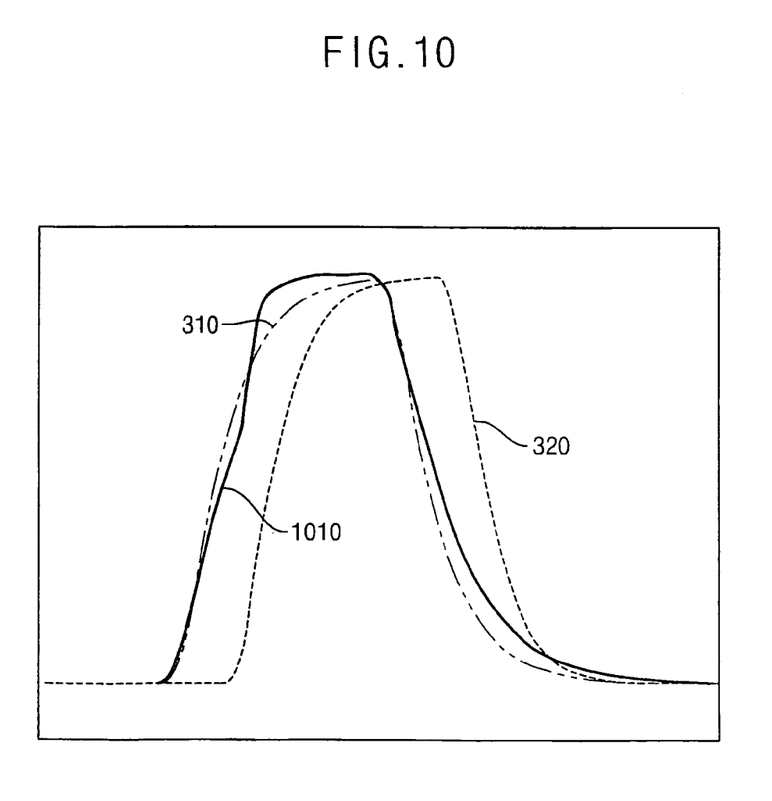
FIG. 10 is an example graph diagram illustrating an example simulation result of a driver according to an example embodiment.

FIG. 10 is an example graph diagram illustrating an example simulation result of a driver according to an example embodiment.

As shown in FIG. 10, a driving signal distortion may be reduced if the simulation result 1010 of a driver according to an example embodiment is compared with the simulation result 310 of a driver using a conventional method of reducing a driving signal distortion by increasing a size of the driver and/or the simulation result 320 of a conventional method of reducing a driving signal distortion by disposing a buffer between loads.

Figure 11:
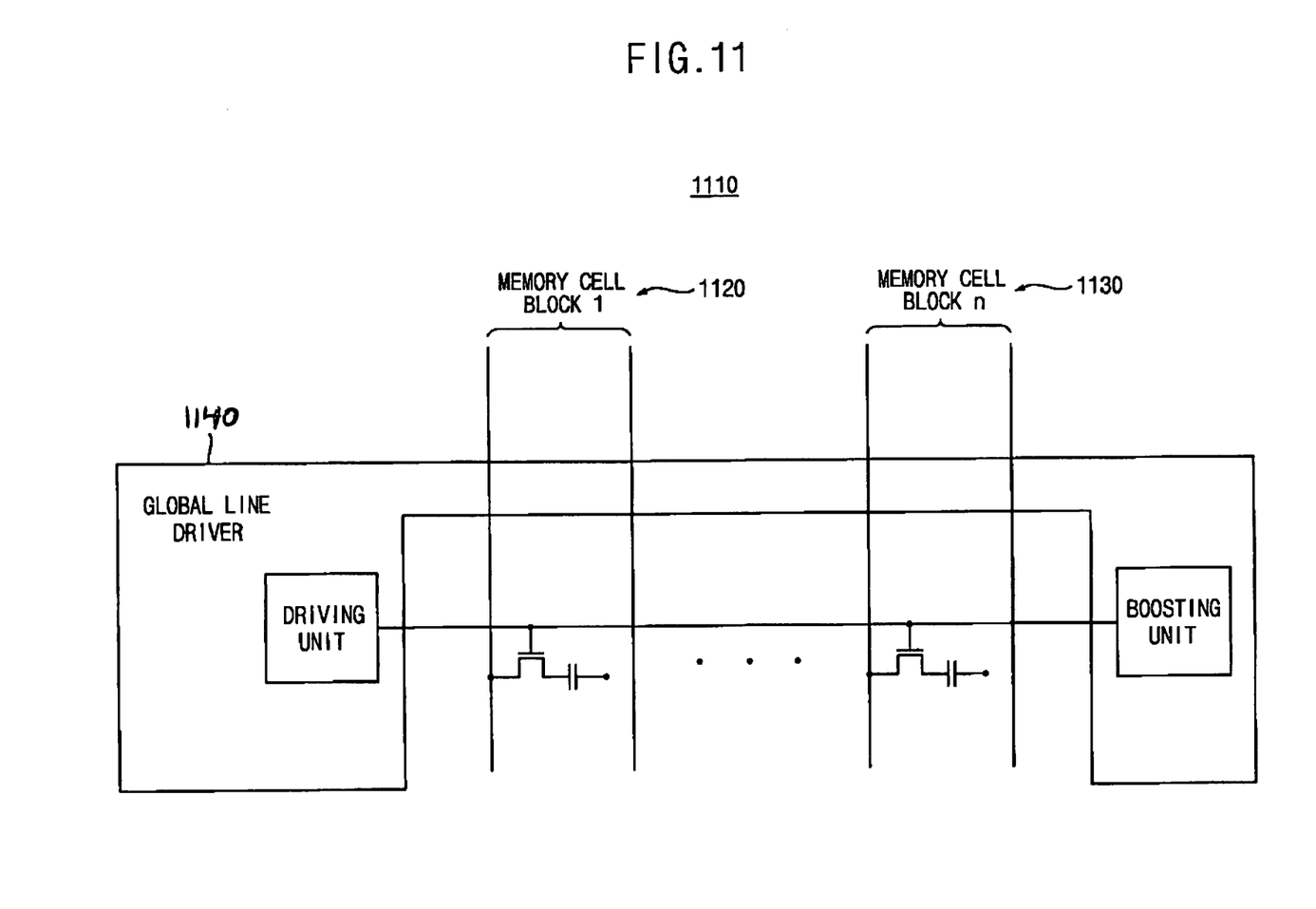
FIG. 11 is a diagram illustrating a semiconductor memory device having a driver according to an example embodiment.

FIG. 11 is a diagram illustrating a semiconductor device having a driver according to an example embodiment. Although an example of a semiconductor memory device is illustrated in FIG. 11, example embodiments are not limited thereto, and example embodiments may be employed in other semiconductor devices including a driver.

Referring to FIG. 11, the semiconductor memory device 1110 may include at least one memory block 1120 and 1130 and/or a global line driver 1140.

The global line driver 1140 may provide a driving signal to the at least one memory block 1120 and 1130 to drive a desired, or alternatively, a predetermined global line of the at least one memory block 1120 and 1130, and/or the global line driver 1140 may boost the driving signal based on transition time points of the driving signal to reduce a distortion of the driving signal.

A structure of the global line driver 1140 may be substantially the same as a structure of the driver 400 of FIG. 4, and therefore, a detailed description thereof is be omitted.

As described above, a driver according to an example embodiment may reduce a driving signal distortion by boosting the driving signal based on transition time points of the driving signal. A driver according to an example embodiment may reduce unnecessary power consumption by boosting the driving signal only during a desired, or alternatively, a predetermined time period.

A semiconductor memory device including a driver according to an example embodiment may reduce a driving signal distortion by boosting the driving signal based on transition time points of the driving signal. A semiconductor memory device according to an example embodiment may reduce unnecessary power consumption by boosting the driving signal only during a desired, or alternatively, a predetermined time period.

Although example embodiments have been shown and described in this specification and figures, it would be appreciated by those skilled in the art that changes may be made to the illustrated and/or described example embodiments without departing from their principles and spirit.

What is claimed is:

1. A driver, comprising:
   a driving unit configured to provide a driving signal to at least one load; and
   a boosting unit configured to boost the driving signal based on transition time points of the driving signal to reduce a distortion of the driving signal, the transition time points being time points during a transition of the driving signal from a first level to a second level.

2. The driver of claim 1, wherein the boosting unit is configured to start boosting the driving signal if the transition of the driving signal starts and maintain boosting of the driving signal during a time period.

3. The driver of claim 2, wherein the boosting unit is configured to stop boosting the driving signal if the transition of the driving signal is finished.

4. The driver of claim 1, wherein the boosting unit is configured to generate an inverted driving signal based on the driving signal if the transition of the driving signal starts and boost the driving signal based on a delay time between the driving signal and the inverted driving signal.

5. The driver of claim 4, wherein the delay time is less than a difference between a starting time point of the transition of the driving signal and a finishing time point of the transition of the driving signal.

6. The driver of claim 5, wherein
   the boosting unit includes a delay controlled inverting unit configured to receive the driving signal and invert the driving signal to generate the inverted driving signal with the delay time, and
   the boosting unit is configured to boost the driving signal by providing at least one of a current and a voltage to the at least one load during the delay time.

7. The driver of claim 6, wherein the boosting unit further includes:
   a power source configured to provide the at least one of the current and the voltage to the at least one load based on a control signal; and
   a power source controller configured to provide the control signal during the delay time to the power source to provide the at least one of the current and the voltage.

8. The driver of claim 1, wherein the boosting unit is configured to generate an inverted driving signal based on the driving signal, control a delay time between the driving signal and the inverted driving signal, and boost the driving signal based on the delay time.

9. The driver of claim 8, wherein the delay time is less than a difference between a starting time point of the transition of the driving signal and a finishing time point of the transition of the driving signal.

10. The driver of claim 9, wherein
    the boosting unit includes a variable delay controlled inverting unit configured to receive the driving signal and invert the driving signal to generate the inverted driving signal with the delay time, and
    the boosting unit is configured to boost the driving signal by providing at least one of a current and a voltage to the at least one load during the delay time.

11. The driver of claim 10, wherein the variable delay controlled inverting unit includes:
    a plurality of inverters having an inverter delay time, the inverters being serially coupled, configured to receive the driving signal, and configured to sequentially invert the driving signal; and
    a selector configured to sequentially receive the inverted driving signals and select one of the inverted driving signals based on a selection signal.

12. The driver of claim 11, wherein the selection signal is at least one of input from outside and determined based on a value of a system.

13. The driver of claim 11, wherein the boosting unit further includes:
    a power source configured to provide the at least one of the current and the voltage to the at least one load based on a control signal; and
    a power source controller configured to provide the control signal during the delay time to the power source to provide the at least one of the current and the voltage.

14. A semiconductor memory device, comprising:
    at least one memory block; and
    a global line driver configured to provide a driving signal to the at least one memory block to drive a global line of the at least one memory block and configured to boost the driving signal based on transition time points of the driving signal to reduce a distortion of the driving signal, the transition time points being time points during a transition of the driving signal from a first level to a second level.

15. The semiconductor memory device of claim 14, wherein the global line driver includes:
    a driving unit configured to provide the driving signal to the at least one memory cell; and
    a boosting unit configured to boost the driving signal based on the transition time points of the driving signal to reduce the distortion of the driving signal.

16. The semiconductor memory device of claim 15, wherein
    the boosting unit is configured to start boosting the driving signal if the transition of the driving signal starts and maintain boosting of the driving signal during a time period, and
    the boosting unit is configured to stop boosting the driving signal if the transition of the driving signal is finished.

17. The semiconductor memory device of claim 15, wherein the boosting unit is configured to generate an inverted driving signal based on the driving signal if a transition of the driving signal starts and boost the driving signal based on a delay time between the driving signal and the inverted driving signal.

18. The semiconductor memory device of claim 17, wherein the delay time is less than a difference between a starting time point of the transition of the driving signal and a finishing time point of the transition of the driving signal.

19. The semiconductor memory device of claim 18, wherein
the boosting unit includes a delay controlled inverting unit configured to receive the driving signal and invert the driving signal to generate the inverted driving signal with the delay time, and
the boosting unit is configured to boost the driving signal by providing at least one of a current and a voltage to the at least one load during the delay time.

20. The semiconductor memory device of claim 19, wherein the boosting unit further includes:
a power source configured to provide the at least one of the current and the voltage to the at least one load based on a control signal; and
a power source controller configured to provide the control signal during the delay time to the power source to provide the at least one of the current and the voltage.

21. The semiconductor memory device of claim 15, wherein
the boosting unit is configured to generate an inverted driving signal based on the driving signal, control a delay time between the driving signal and the inverted driving signal, and boost the driving signal based on the delay time, and
the delay time is less than a difference between a starting time point of the transition of the driving signal and a finishing time point of the transition of the driving signal.

22. The semiconductor memory device of claim 21, wherein
the boosting unit includes a variable delay controlled inverting unit configured to receive the driving signal and invert the driving signal to generate the inverted driving signal with the delay time, and
the boosting unit is configured to boost the driving signal by providing at least one of a current and a voltage to the at least one load during the delay time.

23. The semiconductor memory device of claim 22, wherein the variable delay controlled inverting unit includes:
a plurality of inverters having an inverter delay time, the inverters being serially coupled, configured to receive the driving signal, and configured to sequentially invert the driving signal; and
a selector configured to sequentially receive the inverted driving signals and select one of the inverted driving signals based on a selection signal.

24. The semiconductor memory device of claim 22, wherein the selection signal is at least one of input from outside and determined based on a value of a system.

25. The semiconductor memory device of claim 22, wherein the boosting unit further includes:
a power source configured to provide the at least one of the current and the voltage to the at least one load based on a control signal; and
a power source controller configured to provide the control signal during the delay time to the power source to provide the at least one of the current and the voltage.

* * * * *